United States Patent
Wang et al.

(10) Patent No.: US 10,545,616 B2
(45) Date of Patent: Jan. 28, 2020

(54) TOUCH DISPLAY PANEL, FLEXIBLE DISPLAY PANEL AND DISPLAY APPARATUS

(71) Applicant: BOE TECHNOLOGY GROUP CO., LTD., Beijing (CN)

(72) Inventors: Haisheng Wang, Beijing (CN); Xue Dong, Beijing (CN); Jing Lv, Beijing (CN); Chunwei Wu, Beijing (CN); Yingming Liu, Beijing (CN); Xiaoliang Ding, Beijing (CN); Rui Xu, Beijing (CN); Lijun Zhao, Beijing (CN); Changfeng Li, Beijing (CN); Wei Liu, Beijing (CN); Pengpeng Wang, Beijing (CN); Yanan Jia, Beijing (CN); Yanling Han, Beijing (CN); Xueyou Cao, Beijing (CN); Ping Zhang, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/545,142

(22) PCT Filed: Feb. 16, 2017

(86) PCT No.: PCT/CN2017/073769
§ 371 (c)(1),
(2) Date: Jul. 20, 2017

(87) PCT Pub. No.: WO2017/206547
PCT Pub. Date: Dec. 7, 2017

(65) Prior Publication Data
US 2018/0210571 A1      Jul. 26, 2018

(30) Foreign Application Priority Data
Jun. 3, 2016 (CN) .......................... 2016 1 0391230

(51) Int. Cl.
*G06F 3/041* (2006.01)
*G06F 3/042* (2006.01)

(52) U.S. Cl.
CPC ............ *G06F 3/042* (2013.01); *G06F 3/0412* (2013.01); *G06F 2203/04103* (2013.01)

(58) Field of Classification Search
CPC ......... G09G 2360/14; G09G 2360/132; G09G 2360/144; G09G 2360/147; G09G 2360/148
(Continued)

(56) References Cited

U.S. PATENT DOCUMENTS

2005/0007353 A1* 1/2005 Smith .................. G09G 3/3233
                                                          345/204
2010/0194710 A1* 8/2010 Koito .................... G06F 3/0412
                                                          345/174
(Continued)

FOREIGN PATENT DOCUMENTS

CN     101471034 A     7/2009
CN     101635276 A     1/2010
(Continued)

OTHER PUBLICATIONS

International Search Report and Written Opinion, for PCT Patent Application No. PCT/CN2017/073769, dated Apr. 21, 2017, 18 pages.
(Continued)

*Primary Examiner* — Roy P Rabindranath
(74) *Attorney, Agent, or Firm* — Kinney & Lange, P.A.

(57) ABSTRACT

The present disclosure provides a touch display panel, a flexible display panel and a display apparatus. In one embodiment, light sensitive effect-based photo-sensitive diodes and switching transistors for controlling signal output of the photo-sensitive diodes are integrated in the display
(Continued)

panel. Once a touch operation of an object (e.g., a finger) is implemented on a surface of the display panel, the photosensitive diode in a corresponding position can convert a sensed light intensity difference into an electrical signal difference to achieve detection of the touch operation.

6 Claims, 3 Drawing Sheets

(58) Field of Classification Search
USPC .................................................. 345/76–81
See application file for complete search history.

(56) References Cited

U.S. PATENT DOCUMENTS

| 2011/0043473 | A1 | 2/2011 | Kozuma |
| 2011/0096027 | A1* | 4/2011 | Jeon ...................... G06F 3/0412 345/175 |
| 2011/0221725 | A1* | 9/2011 | Murai ................... G06F 3/0412 345/207 |
| 2012/0001841 | A1* | 1/2012 | Gokingco ................ G01J 1/32 345/102 |
| 2015/0331508 | A1 | 11/2015 | Nho et al. |

FOREIGN PATENT DOCUMENTS

| CN | 101996006 A | 3/2011 |
| CN | 104009067 A | 8/2014 |
| CN | 105867696 A | 8/2016 |
| CN | 205788140 U | 12/2016 |

OTHER PUBLICATIONS

Second Chinese Office Action dated Nov. 30, 2018, received for corresponding Chinese Application No. 201610391230.4.

* cited by examiner

| R | G | B | S | R | G | B | S | R | G | B | S |
|---|---|---|---|---|---|---|---|---|---|---|---|
| R | G | B | S | R | G | B | S | R | G | B | S |
| R | G | B | S | R | G | B | S | R | G | B | S |
| R | G | B | S | R | G | B | S | R | G | B | S |
| R | G | B | S | R | G | B | S | R | G | B | S |
| R | G | B | S | R | G | B | S | R | G | B | S |
| R | G | B | S | R | G | B | S | R | G | B | S |
| R | G | B | S | R | G | B | S | R | G | B | S |
| R | G | B | S | R | G | B | S | R | G | B | S |

TOUCH DISPLAY PANEL, FLEXIBLE DISPLAY PANEL AND DISPLAY APPARATUS

CROSS-REFERENCE TO RELATED APPLICATION

The present application is a 371 National Stage application of International Application No. PCT/CN2017/073769, filed on 16 Feb. 2017, which has not yet published, and which claims priority to a Chinese Patent Application (of which the patent application number is No. 201610391230.4) filed on Jun. 3, 2016 in China and titled as "Touch Display panel, Flexible Display Panel And Display Apparatus", the disclosure of which is hereby incorporated by reference in its entirety.

BACKGROUND

1. Technical Field

The present disclosure relates to the field of display technology, and particularly to a touch display panel, a flexible display panel and a display apparatus.

2. Description of the Related Art

With the rapid development of display technology, touch screen panels have gradually spread to people's lives. At present, in accordance with structures and compositions, the touch screen panels are divided into "add on mode touch panel", "on-cell touch panel" and "in-cell touch panel". An in-cell touch panel has a structure in which touch components are provided inside the display panel, which facilitates thinning and light weight of the display panel. Nowadays, generally, detection of a touch operation is achieved through capacitance and induction inside the display panel. As parasitic capacitance easily occurs between capacitance detecting electrodes and components inside the display panels, touch detection signals and display signals can interfere with each other, which adversely affects detection quality of the touch operation.

SUMMARY

Accordingly, in accordance with an embodiment of the present disclosure, there provides a touch display panel comprising: a plurality of photo-sensitive sensing units arranged in an array, inside the display panel; wherein, each of the photo-sensitive sensing units comprises a photo-sensitive diode configured to sense a light intensity change outside the display panel and a switching transistor configured to control an output of the light intensity change sensed by the photo-sensitive diode, and, the display panel is a flexible display panel.

In a possible implementation of the abovementioned touch display panel according to the embodiment of the present disclosure, a pitch between every adjacent two of the photo-sensitive diodes is not greater than 300 μm.

In a possible implementation of the abovementioned touch display panel according to the embodiment of the present disclosure, each photo-sensitive diode comprises an infrared photo-sensitive diode.

In a possible implementation of the abovementioned touch display panel according to the embodiment of the present disclosure, each switching transistor is made of the same material and arranged in the same layer as a corresponding thin-film transistor in a corresponding layer included in the display panel.

In a possible implementation of the abovementioned touch display panel according to the embodiment of the present disclosure, the touch display panel comprises an organic electroluminescent touch display panel inside which the plurality of photo-sensitive sensing units arranged in an array are disposed.

In a possible implementation of the abovementioned touch display panel according to the embodiment of the present disclosure, a cathode of each photo-sensitive diode is in the same layer as and is integrated with a cathode of the organic electroluminescent touch display panel.

In a possible implementation of the abovementioned touch display panel according to the embodiment of the present disclosure, an anode of each photo-sensitive diode is in the same layer as but is insulated from an anode of a corresponding light-emitting device of the organic electroluminescent touch display panel.

In a possible implementation of the abovementioned touch display panel according to the embodiment of the present disclosure, each of the photo-sensitive sensing units is disposed within a region, where a pattern for a pixel definition layer is located, of the organic electroluminescent touch display panel; or, each of the photo-sensitive sensing units is disposed within a pixel region, which is defined by the pattern for the pixel definition layer, of the organic electroluminescent touch display panel.

In another aspect, in accordance with an embodiment of the present disclosure, there provides a flexible display panel, comprising: a plurality of thin-film transistors and a plurality of switching transistors arranged in an array, disposed on a flexible substrate; light-emitting devices corresponding one-to-one to the thin-film transistors and photo-sensitive diodes corresponding one-to-one to the switching transistors, the light-emitting devices and the photo-sensitive diodes being disposed over the respective thin-film transistors and the respective switching transistors; and a packaging thin film disposed over the light-emitting devices and the photo-sensitive diodes; wherein, each of the light-emitting devices comprises an anode connected to a drain of a corresponding one of the thin-film transistors, a light-emitting layer and a cathode, which are laminated in sequence; and each of the photo-sensitive diodes comprises an anode connected to a drain of a corresponding one of the switching transistors, a photo-sensitive material layer and a cathode, laminated in sequence.

In a possible implementation of the abovementioned flexible display panel according to the embodiment of the present disclosure, the cathode of each of the light-emitting devices is in the same layer as and is integrated with the cathode of each of the photo-sensitive diodes.

In a possible implementation of the abovementioned flexible display panel according to the embodiment of the present disclosure, the anode of each of the photo-sensitive diodes is in the same layer as but is insulated from the anode of each of the light-emitting devices.

In a possible implementation of the abovementioned flexible display panel according to the embodiment of the present disclosure, the photo-sensitive material layer in each of the photo-sensitive diodes comprises an infrared photo-sensitive material layer.

In a possible implementation of the abovementioned flexible display panel according to the embodiment of the present disclosure, the switching transistors and the thin-film transistor each is in form of a top-gate type structure.

In a possible implementation of the abovementioned flexible display panel according to the embodiment of the present disclosure, a pitch between every adjacent two of the photo-sensitive diodes is not greater than 300 μm.

In a possible implementation of the abovementioned flexible display panel according to the embodiment of the present disclosure, the flexible display panel further comprises: a light shading polarizer disposed over the packaging thin film.

In a possible implementation of the abovementioned flexible display panel according to the embodiment of the present disclosure, the flexible display panel further comprises: a protective film disposed over the light shading polarizer.

In yet another aspect, in accordance with an embodiment of the present disclosure, there provides a display apparatus comprising the touch display panel according to the embodiments of the present disclosure or the flexible display panel according to the embodiments of the present disclosure.

DETAILED DESCRIPTION OF THE EMBODIMENTS

Embodiments of a touch display panel, a flexible display panel and a display apparatus according to the present disclosure will be described hereinafter in detail with reference to the attached drawings.

Forms and sizes of these components shown in Figures are not used to reflect actual scales, but are intended to schematically illustrate contents of the present disclosure.

Figure 1:
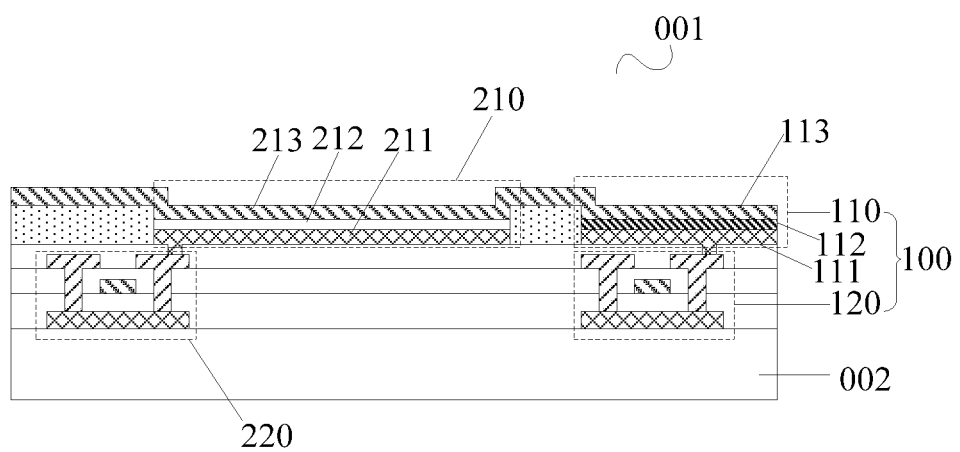
FIG. 1 is a structural schematic view of a touch display panel according to an embodiment of the present disclosure.

In accordance with embodiments of the present disclosure, there provides a touch display panel. Referring to FIG. 1, the touch display panel includes a plurality of photo-sensitive sensing units 100 arranged in an array inside the display panel 001. Each of the photo-sensitive sensing units 100 includes a photo-sensitive diode 110 configured to sense a light intensity change outside the display panel 001, and a switching transistor 120 configured to control an output of the light intensity change sensed by the photo-sensitive diode 110.

In the abovementioned touch display panel according to embodiments of the present disclosure, light sensitive effect-based photo-sensitive diodes 110 and switching transistors 120 for controlling signal output of the photo-sensitive diodes 110 are integrated in the display panel 001. Once a touch operation of an object (e.g., a finger) is implemented on a surface of the display panel 001, the photo-sensitive diode 110 in a corresponding position can convert a sensed light intensity difference into an electrical signal difference to achieve detection of the touch operation. The photo-sensitive diode 110 performs the detection of the touch operation based on light sensitivity, which is prone to have no interference with components inside the display panel, thereby easily achieving high quality detection of the touch operation.

Moreover, in the abovementioned touch display panel according to embodiments of the present disclosure, the photo-sensitive diode 110 may be an infrared photo-sensitive diode, or may be a photo-sensitive diode which is sensitive to visible lights having a certain range of wavelengths. Since the photo-sensitive diodes 110 of the photo-sensitive sensing units 100 are provided inside the display panel 001, both display-purposed visible lights emitted by the display panel 001 and ambient light are sensed by adjacent photo-sensitive diodes 110. In this circumstance, in an embodiment in which a photo-sensitive diode which is sensitive to visible lights having certain range of wavelengths is adopted, in order to eliminate interference of the display-purposed visible lights with detection of the touch operation, a time-sharing driving may be implemented for display panel 001. A part of the display time may be selected as a special touch detection time, within which the display panel displays a pure color image so that influence of the visible lights which are emitted from different locations of the display panel and which have different intensities do not affect detection of touch operations at these photo-sensitive diodes when certain images are displayed. In an embodiment in which an infrared photo-sensitive diode is adopted, display-purposed visible lights emitted by the display panel 001 have no interference with the infrared photo-sensitive diode, and the infrared photo-sensitive diode only senses a light intensity change when the infrared light in the ambient light is shielded by the object. Accordingly, the photo-sensitive sensing units 100 can work together with display units of the display panel 001 simultaneously, without any interaction.

Figure 2:
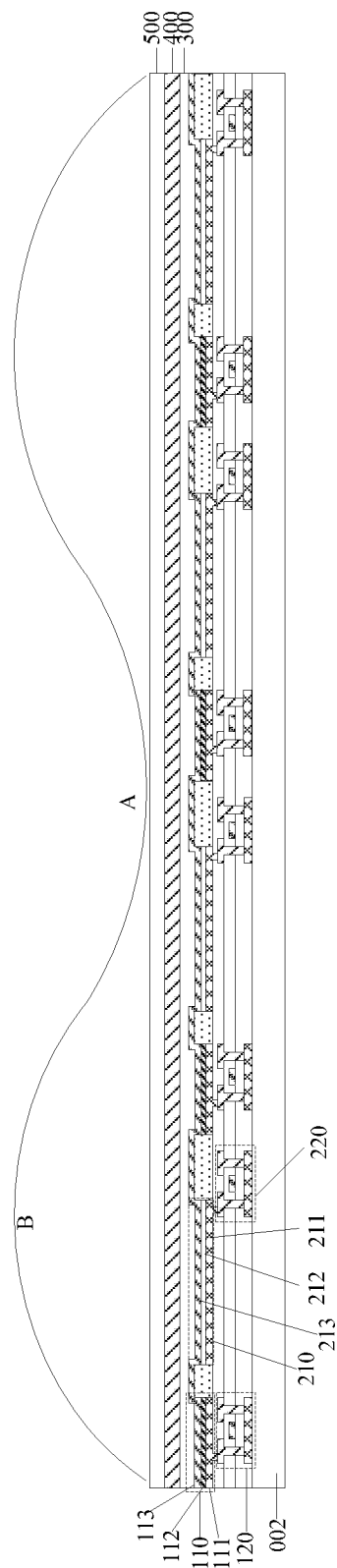
FIG. 2 is a structural schematic view of a flexible display panel according to an embodiment of the present disclosure.

Moreover, the abovementioned touch display panel according to embodiments of the present disclosure also can achieve a fingerprint identification function. Here, referring to FIG. 2, in order to identify ridges A and valleys B in uneven skin surface of a finger, it should be determined that a pitch between every two adjacent photo-sensitive diodes 110 is not more than a spacing between one ridge A and one valley B adjacent thereto. Generally, a spacing between one ridge and one valley of a finger of an adult is between 300 μm to 500 μm. The pitch between the photo-sensitive diodes 110 may be generally set to be about 50 μm. Referring to FIG. 2, once a finger of a user gets close to the surface of the display panel 001, since these ridges A and valleys B are present in the uneven skin surface of the finger, distance between these points in the uneven skin surface of the finger and the surface of the display panel 001 are different from one another, which causes light intensity differences when a light is irradiated on the photo-sensitive diodes 110 located under the finger. By detecting differences of sizes of signals outputted by these photo-sensitive diodes 110 at each moment in the course of touching the surface of the touch display panel with the finger, a two-dimensional fingerprint pattern of a fingerprint of the finger, consisting of these ridges A and valleys B, can be detected, and thus, a fingerprint identification can be achieved.

Specifically, in an embodiment in which infrared photo-sensitive diodes are adopted as the photo-sensitive diodes 110, infrared light in ambient light is capable of penetrating a finger. When a finger is pressed against the surface of the display panel 001, ridge A of the fingerprint comes into contact with the surface of the display panel 001 directly. At this location, the infrared light is radiated directly on the infrared photo-sensitive diode 110 located under this location, substantially without any total reflection, while at a location where valley B of the fingerprint is, the infrared light is radiated on the infrared photo-sensitive diode 110 located under this location after being totally reflected as there is air between the valley B of the fingerprint and the surface of the display panel 001. Accordingly, the light intensity radiated on the infrared photo-sensitive diode 110 located under the ridge A is greater than the light intensity radiated on the infrared photo-sensitive diode 110 located under the valley B. Accordingly, detection of the fingerprint can be achieved by detecting and analyzing the signals outputted by the infrared photo-sensitive diodes 110.

In an embodiment in which visible photo-sensitive diodes are adopted as the photo-sensitive diodes 110, visible light in ambient light cannot penetrate a finger. When a finger is pressed against the surface of the display panel 001, the ambient light is shielded by the finger and the display-purposed light is capable of being irradiated on the finger. The light intensity of the light reflected back to the photo-sensitive diode varies since shapes of the valleys and the ridges of the finger are different. Ridge A of the fingerprint comes into contact with the surface of the display panel 001 directly. At this location, a majority of the display-purposed light is reflected onto the visible photo-sensitive diode 110 located under this location, while at a location where a valley B of the fingerprint is, a minority of the display-purposed light is radiated on the visible photo-sensitive diode 110 located under this location after being refracted as there is air between the valley B of the fingerprint and the surface of the display panel 001. Accordingly, the light intensity radiated on the visible photo-sensitive diode 110 located under the ridge A is greater than the light intensity radiated on the visible photo-sensitive diode 110 located under the valley B. Accordingly, detection of the fingerprint can be achieved by detecting and analyzing signals outputted by the visible photo-sensitive diodes 110.

Moreover, in the abovementioned touch display panel according to embodiments of the present disclosure, there is no limitation on the type of the display panel 001. The display panel 001 may be specifically a liquid crystal display panel, may be an electroluminescent display panel, or may be a tablet display panel including a plasma display panel or an electronic paper and the like, and there is no limitation on this herein.

Meanwhile, the abovementioned touch display panel according to embodiments of the present disclosure may also be specifically used in a flexible display panel, for example, in a flexible organic electroluminescent display panel. Here, referring to FIG. 2, a plurality of photo-sensitive sensing units 100 arranged in an array are disposed inside the flexible organic electroluminescent display panel. In this case, generally, a packaging thin film 300 (TFE), a light shading polarizer 400 (POL) and a protective film 500 (cover film) are included between photo-sensitive diodes 110 of photo-sensitive sensing units 100 and a surface of the display panel 001. In this flexible display panel, generally, the packaging thin film 300 has a thickness of approximately 5 μm to 10 μm, the light shading polarizer 400 has a thickness of about 70 μm, and the protective film 500 has a thickness of approximately 50 μm to 100 μm. In this case, a distance between the photo-sensitive diodes 110 and the surface of the display panel 001 is about 150 μm, which is extremely suitable to detect valleys B and ridges A of a fingerprint. Accordingly, the abovementioned touch display panel according to embodiments of the present disclosure may also be used in a flexible display panel for implementing a fingerprint identification and will achieve a good fingerprint identification effect.

In a specific implementation, in the abovementioned touch display panel according to embodiments of the present disclosure, these photo-sensitive sensing units 100 are disposed inside the display panel 001. Accordingly, the switching transistors 120 of the photo-sensitive sensing units 100 may be made of the same material and arranged in the same layer as corresponding thin-film transistors 220 in a corresponding layer included in the display panel 001. That is, the switching transistors 120 may be manufactured while manufacturing the thin-film transistors 220 included in the display panel 001. In this way, no new process step is added to original manufacturing process, which ensures manufacturing cost.

In a specific implementation, a photo-sensitive diode 110 of the abovementioned touch display panel according to embodiments of the present disclosure, referring to FIG. 1, is generally comprised of an anode 111 connected to a drain of a corresponding switching transistor 120, a photo-sensitive material layer 112 and a cathode 113, which are laminated in sequence. A light-emitting device 210 of the organic electroluminescent display panel, referring to FIG. 1, generally comprises an anode 211 connected to a drain of a corresponding thin-film transistor 220, a light-emitting layer 212 and a cathode 213, which are laminated in sequence.

Accordingly, in a case that the abovementioned touch display panel according to embodiments of the present disclosure is used in an organic electroluminescent display panel, since the cathode 213 of the organic electroluminescent display panel is generally an electrode with a fixed potential, as shown in FIG. 1, the cathode 113 of each photo-sensitive diode 110 may be in the same layer as, and integrated with, the cathode 213 of the organic electroluminescent display panel. In this way, a stable bias voltage can be provided to the photo-sensitive diode 110 through the cathode 213 of the organic electroluminescent display panel.

Additionally, in a case that the abovementioned touch display panel according to embodiments of the present disclosure is used in an organic electroluminescent display panel, referring to FIG. 1, an anode 111 of each photo-sensitive diode 110 may also be in the same layer as, but is insulated from, an anode 211 of a corresponding light-emitting device 210 in the organic electroluminescent display panel. In this way, the anode 111 of the photo-sensitive diode 110 may be manufactured while manufacturing the anode 211 of the light-emitting device 210 which adds no new process step to original manufacturing process and thus ensures manufacturing cost.

In a specific implementation, in the abovementioned touch display panel according to embodiments of the present disclosure, in order for the addition of the photo-sensitive sensing units 100 to not affect the display effect as much as possible, the photo-sensitive sensing units 100 may be disposed on non-opening regions of pixels in the display panel 001, which does not occupy an area of existing light-emitting regions, thereby ensuring no influence on the display effect. Specifically, in a case that the abovementioned touch display panel according to embodiments of the present disclosure is used in an organic electroluminescent display panel, referring to FIG. 3, the photo-sensitive sensing unit S may be disposed within a region, where a pattern for pixel definition layer (PDL) 600 is located, of the organic electroluminescent display panel.

Figures 3, 4:
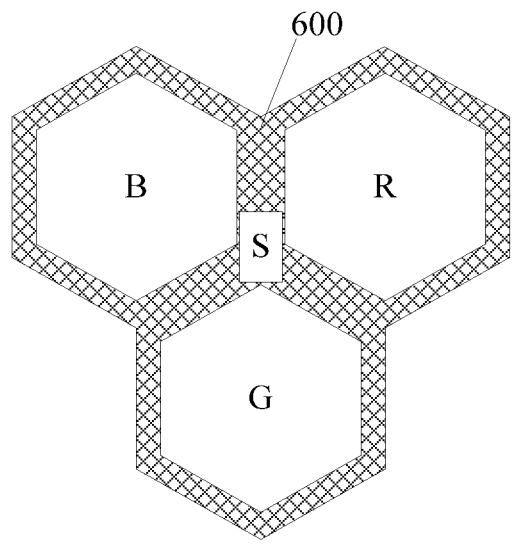
FIG. 3 is a first top view of a touch display panel according to an embodiment of the present disclosure.
FIG. 4 is a second top view of a touch display panel according to an embodiment of the present disclosure.

Of course, if the display effect is not considered, the photo-sensitive sensing unit 100 may also be disposed within a pixel region defined by a pattern for pixel definition layer 600 of the organic electroluminescent display panel. For example, as shown in FIG. 4, the photo-sensitive sensing units S are independently arranged in the pixel region, and are arranged orderly and periodically in the pixel region together with existing sub-pixels RGB.

Based on the same inventive concept, in accordance with embodiments of the present disclosure, there provides a flexible display panel.

In accordance with embodiments of the present disclosure, there provides a flexible display panel. Referring to FIG. 2, the flexible display panel includes a plurality of thin-film transistors 220 and a plurality of switching transistors 120 arranged in an array, disposed on a flexible substrate 002; light-emitting devices 210 corresponding one-to-one to the thin-film transistors 220 and photo-sensitive diodes 110 corresponding one-to-one to the switching transistors 120, the light-emitting devices 210 and the photo-sensitive diodes 110 being disposed over the respective thin-film transistors 220 and the respective switching transistors 120; and a packaging thin film 300 disposed over the light-emitting devices 210 and the photo-sensitive diodes 110.

Each of the light-emitting devices 210 comprises an anode 211 connected to a drain of a corresponding thin-film transistor 220, a light-emitting layer 212 and a cathode 213, which are laminated in sequence.

Each of the photo-sensitive diodes 110 include an anode 111 connected to a drain of a corresponding switching transistor 120, a photo-sensitive material layer 112 and a cathode 113, laminated in sequence.

The abovementioned flexible display panel according to embodiments of the present disclosure may be integrated with light sensitive effect-based photo-sensitive diodes 110 and switching transistors 120 for controlling signal output of the photo-sensitive diodes 110. Once a touch operation of an object (e.g., a finger) is implemented on a surface of the flexible display panel, the photo-sensitive diode 110 in a corresponding position can convert a sensed light intensity difference into an electrical signal difference to achieve detection of the touch operation. The photo-sensitive diode performs the detection of the touch operation based on a light sensitivity effect, which is prone to have no interference with components inside the display panel, thereby easily achieving high quality detection of the touch operation.

Moreover, in the abovementioned flexible display panel according to embodiments of the present disclosure, the photo-sensitive material layer 112 of the photo-sensitive diode 110 may be an infrared photo-sensitive material layer. That is, the photo-sensitive diode 110 may be an infrared photo-sensitive diode. Since both display-purposed visible lights emitted by the flexible display panel and ambient light are sensed by adjacent photo-sensitive diodes 110, an infrared photo-sensitive diode is adopted. Display-purposed visible lights emitted by the flexible display panel have no interference with the infrared photo-sensitive diode, and the infrared photo-sensitive diode only senses a light intensity change when the infrared light in the ambient light is shielded by the object. Accordingly, the infrared photo-sensitive diode can work together with the light-emitting device 210 of the flexible display panel simultaneously, without any interaction. Of course, a photo-sensitive diode which is sensitive to visible lights having a certain range of wavelengths may also be adopted. In a case that a photo-sensitive diode which is sensitive to visible lights having a certain range of wavelengths is adopted, in order to eliminate interference of the display-purposed visible lights with detection of the touch operation, a time-sharing driving may be implemented for the flexible display panel. A part of the display time may be selected as a special touch detection time, within which the display panel displays a pure color image, so that influence of the visible lights, which are emitted from different locations of the display panel and which have different intensities, do not affect detection of touch operations at these photo-sensitive diodes when certain images are displayed.

Moreover, the abovementioned flexible display panel according to embodiments of the present disclosure also can achieve a fingerprint identification function. Here, in order to identify ridges A and valleys B in uneven skin surface of a finger, it should be determined that a pitch between every two adjacent photo-sensitive diodes 110 is not more than a spacing between one ridge A and one valley B adjacent thereto. Referring to FIG. 2, once a finger of a user gets close to the surface of the flexible display panel 001, since these ridges A and valleys B are presented in an uneven skin surface of the finger, distances between these points in the uneven skin surface of the finger and the surface of the flexible display panel 001 are different from one another, which causes light intensity differences when a light is irradiated on the photo-sensitive diodes 110 located under the finger. By detecting differences in sizes of the signals outputted by these photo-sensitive diodes 110 at each moment in the course of touching the surface of the flexible display panel with the finger, a two-dimensional fingerprint pattern of a fingerprint, consisting of these ridges A and valleys B, of the finger can be detected, and thus, a fingerprint identification can be achieved.

In a specific implementation, referring to FIG. 2, the abovementioned flexible display panel according to embodiments of the present disclosure may also include a light shading polarizer 400 disposed over the packaging thin film 300 to shield reflection of the ambient light by reflecting material in the flexible display panel so as to avoid influence on the displaying.

In a specific implementation, referring to FIG. 2, the abovementioned flexible display panel according to embodiments of the present disclosure may also include a protective film 500 disposed over the light shading polarizer 400, to protect the surface of the flexible display panel.

What's more, in this flexible display panel, generally, the packaging thin film 300 has a thickness of approximately 5 μm to 10 μm, the light shading polarizer 400 has a thickness of about 70 μm, and the protective film 500 has a thickness of approximately 50 μm to 100 μm. In this case, a distance between the photo-sensitive diodes 110 and the surface of the flexible display panel 001 is about 150 μm, which is extremely suitable to detect valleys B and ridges A of a fingerprint. Accordingly, the abovementioned flexible display panel according to embodiments of the present disclosure will achieve a good fingerprint identification effect when implementing a fingerprint identification.

In a specific implementation, referring to FIG. 2, in the abovementioned flexible display panel according to embodiments of the present disclosure, the cathode 213 of each light-emitting device 210 is in the same layer as and is integrated with the cathode 113 of a corresponding photo-sensitive diode 110. In this way, a stable bias voltage can be provided to the photo-sensitive diode 110 through the cathode 213 of each light-emitting device 210.

In a specific implementation, referring to FIG. 2, in the abovementioned flexible display panel according to embodiments of the present disclosure, an anode 111 of each photo-sensitive diode 110 is in the same layer as but is insulated from an anode 211 of a corresponding light-emitting device 210. In this way, the anode 111 of the photo-sensitive diode 110 may be manufactured while manufacturing the anode 211 of the light-emitting device 210, which adds no new process step to original manufacturing process and thus ensures manufacturing cost.

In a specific implementation, referring to FIG. 2, in the abovementioned flexible display panel according to embodiments of the present disclosure, the switching transistors 120 and the thin-film transistor 220 each is in form of a top-gate type structure. Of course, a bottom-gate type structure may also be adopted, and there is no limitation on this.

Based on the same inventive concept, in accordance with embodiments of the present disclosure, there provides a display apparatus comprising the abovementioned touch display panel according to embodiments of the present disclosure or the abovementioned flexible display panel according to embodiments of the present disclosure. The display apparatus may be any product or part having a display function, including a mobile phone, tablet computer, TV, display, notebook computer, digital frame, navigator and the like. Implementations of the display apparatus may refer to those of the touch display panel or the flexible display panel, and repeated description are omitted.

In the abovementioned touch display panel, the flexible display panel and the display apparatus according to embodiments of the present disclosure, light sensitive effect-based photo-sensitive diodes and switching transistors for controlling signal output of the photo-sensitive diodes are integrated in the display panel. Once a touch operation of an object (e.g., a finger) is implemented on a surface of the display panel, the photo-sensitive diode in a corresponding position can convert a sensed light intensity difference into an electrical signal difference to achieve detection of the touch operation. The photo-sensitive diode performs the detection of the touch operation based on light sensitive effect, which is prone to have no interference with components inside the display panel, thereby easily achieving high quality detection of the touch operation.

Obviously, those skilled in the art may make various changes or modifications in these embodiments without departing from the principles and spirit of the present disclosure. And, the present disclosure intends to include these changes or modifications if they are included within the scope of the present disclosure and the scope of which is defined in the claims and their equivalents.

What is claimed is:

1. A touch display panel, comprising: a plurality of photo-sensitive sensing units arranged in an array inside the touch display panel; wherein each of the photo-sensitive sensing units comprises a photo-sensitive diode configured to sense a light intensity change outside the touch display panel, and a switching transistor configured to control an output of the light intensity change sensed by the photo-sensitive diode, wherein a pitch between each adjacent ones of the photo-sensitive diodes is not greater than 300 μm, and wherein the touch display panel comprises an organic electroluminescent touch display panel inside which the plurality of photo-sensitive sensing units arranged in the array are disposed, each of the photo-sensitive sensing units being disposed within a region, where a pixel definition layer is located but beyond locations of subpixels, of the organic electroluminescent touch display panel; and a cathode of each of the photo-sensitive diodes is in a same layer as, and is integrated with, a cathode of the organic electroluminescent touch display panel.

2. The touch display panel of claim 1, wherein each of the photo-sensitive diodes comprises an infrared photo-sensitive diode.

3. The touch display panel of claim 1, wherein each switching transistor is made of a same material and arranged in a same layer as a corresponding thin-film transistor in the touch display panel.

4. The touch display panel of claim 1, wherein the pitch between each adjacent ones of the photo-sensitive diodes is about 50 μm.

5. The touch display panel of claim 1, wherein an anode of each of the photo-sensitive diodes is in a same layer as, but is insulated from, an anode of a corresponding light-emitting device of the organic electroluminescent touch display panel.

6. The touch display panel of claim 1, wherein each of the photo-sensitive sensing units is disposed within a region of the organic electroluminescent touch display panel where a pattern for a pixel definition layer is located; or, each of the photo-sensitive sensing units is disposed within a pixel region of the organic electroluminescent touch display panel which is defined by the pattern for the pixel definition layer.

* * * * *